United States Patent
Ko et al.

(10) Patent No.: US 6,883,248 B2
(45) Date of Patent: Apr. 26, 2005

(54) APPARATUS FOR DRYING A SUBSTRATE USING AN ISOPROPYL ALCOHOL VAPOR

(75) Inventors: Yong-Kyun Ko, Osan (KR); Jae-Jun Ryu, Seoul (KR); Hun-Jung Yi, Suwon (KR); Pil-Kwon Jun, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/635,458

(22) Filed: Aug. 7, 2003

(65) Prior Publication Data

US 2004/0045188 A1 Mar. 11, 2004

(30) Foreign Application Priority Data

Sep. 5, 2002 (KR) .................................. 10-2002-0053631

(51) Int. Cl.[7] .............................................. F26B 21/06
(52) U.S. Cl. ............................................................. 34/78
(58) Field of Search .............................. 34/74, 78, 202, 34/210

(56) References Cited

U.S. PATENT DOCUMENTS

| 5,660,642 A | 8/1997 | Britten ........................ 134/30 |
| 5,709,037 A | * 1/1998 | Tanaka et al. ................. 34/330 |
| 5,950,328 A | 9/1999 | Ichiko et al. .................. 34/364 |
| 6,032,382 A | * 3/2000 | Matsumoto et al. ............ 34/78 |
| 6,068,002 A | 5/2000 | Kamikawa et al. ............ 134/66 |
| 6,158,141 A | 12/2000 | Asada et al. .................... 34/74 |
| 6,219,936 B1 | 4/2001 | Kedo et al. .................... 34/381 |

* cited by examiner

Primary Examiner—Stephen Gravini
(74) Attorney, Agent, or Firm—Lee, Sterba & Morse, P.C.

(57) ABSTRACT

An apparatus for drying a substrate using an isopropyl alcohol vapor includes a container for receiving an isopropyl alcohol vapor to dry a plurality of substrates wherein an opening is vertically formed through an upper portion of the container to permit the loading and unloading of the substrates; a supporting member for supporting the plurality of substrates in the container in a vertical direction and for supporting the substrates side by side in a horizontal direction, wherein the supporting member extends through the container and through the opening; and a cover for obstructing a flow of clean air from flowing directly from an air cleaner disposed over the container into the container through the opening. In addition, the apparatus may include an inert gas supplying member to supply an inert gas onto the substrates to prevent native oxide films from forming on the substrates.

36 Claims, 13 Drawing Sheets

APPARATUS FOR DRYING A SUBSTRATE USING AN ISOPROPYL ALCOHOL VAPOR

BACKGROUND OF THE INVENTION

1. Field of the Invention

The present invention relates to an apparatus for drying a substrate. More particularly, the present invention relates to an apparatus for drying a substrate using an isopropyl alcohol vapor.

2. Description of the Related Art

Recently, the technology for manufacturing semiconductor devices has been improved in order to enhance integration density, reliability, response speed, and similar characteristics, thereby meeting various requirements of consumers. Generally, semiconductor devices are manufactured through a series of manufacturing processes for forming various films on a silicon wafer, which is used as semiconductor substrate, into patterns having electrical characteristics after the various films are formed on the semiconductor substrate.

The patterns are formed by repeatedly performing a series of unit manufacturing processes including a film deposition process, a photolithography process, an etching process, an ion implantation process, a polishing process and the like. During the processing, impurities such as reaction by-products and minute particles, remain on the semiconductor substrate. These impurities can cause fatal failures during subsequent manufacturing processes. Thus, a cleaning process and a drying process should be performed on the semiconductor substrate after the unit manufacturing processes. The cleaning process includes a wet cleaning process using various cleaning solutions and a dry cleaning process using a reactive gas. A rinsing process using de-ionized water and a drying process is performed after the cleaning process.

Typically, the drying process may be divided into two processes. First, there is a vapor drying process that removes a fluid (e.g., de-ionized water used in the rinsing process) and particles remaining on the surface of a semiconductor substrate by reducing a surface tension of the remaining fluid on the surface of the semiconductor substrate after an isopropyl alcohol vapor is condensed on the surface of the semiconductor substrate. Second, there is a Marangoni drying process that removes the remaining fluid and particles from the semiconductor substrate by passing the semiconductor substrate through an isopropyl alcohol layer formed on de-ionized water. An isopropyl alcohol vapor or mist is condensed not on the surface of the semiconductor substrate, but on the surface of de-ionized water to form the isopropyl alcohol layer.

FIG. 1 illustrates a schematic cross-sectional view of a conventional apparatus for drying a substrate. FIG. 2 illustrates a schematic side view showing the apparatus for drying a substrate as shown in FIG. 1.

Referring to FIGS. 1 and 2, a substrate drying apparatus 100 dries a plurality of semiconductor substrates W using an isopropyl alcohol vapor 10. In the apparatus, isopropyl alcohol 12 is received in a container 102, and a heater 104 is disposed beneath the container 102 to heat the isopropyl alcohol 12, thereby generating the isopropyl alcohol vapor 10.

An opening 102a is formed through an upper portion of the container 102 for loading and unloading the substrates W. A supporting member 110 for supporting the substrates W extends to the outside of the container 102 through the opening 102a. The supporting member 110 may include a plurality of holders 112 and a plurality of vertical arms 114 connected to the plurality of holders 112. The plurality of holders 112 support the substrates W in the vertical direction and side by side in the horizontal direction. The vertical arms 114 extend upwardly through the container 102 and out through the opening 102a. A plurality of slots (not shown) are formed in the holders 114, each of the slots supporting a corresponding one of the plurality of substrates W.

In operation, the substrates W are loaded into the container 102 through the opening 102a. The substrates W are dried at a position adjacent to the isopropyl alcohol 12 received in the container 102. A cooling coil 116 is disposed over the substrates W, which are supported by the supporting member 110, in order to condense the isopropyl alcohol vapor 10. The cooling coil 116 is installed along an inner sidewall of the container 102. The isopropyl alcohol vapor 10 in the container 102 is condensed via the cooling coil 116, and then the condensed isopropyl alcohol drops to a lower portion of the container 102.

The isopropyl alcohol vapor 10 generated by the heater 104 condenses on the surfaces of the substrates W, which have a relatively low temperature. At that time, a surface tension of the fluid on the surfaces of the substrates W weakens due to the condensed isopropyl alcohol so that the fluid flows down from the surfaces of the substrates W. The remaining impurities on the substrates W are removed from the substrates W by the flow of the fluid having the weakened surface tension.

A receiver tray 118 is installed under the substrates W, which are supported by the supporting member 110, to receive the fluid dripped from the substrates W. A draining pipe 120 is connected to the receiver tray 118 for draining the fluid from the receiver tray 118. The draining pipe 120 passes through a sidewall of the container 102 and extends to the outside. An isopropyl alcohol supplying pipe 122 is connected to an opposite sidewall of the container 102 to provide the isopropyl alcohol 12 into the container 102.

An air cleaner 160 for providing clean air is disposed over the container 102 to prevent minute particles from flowing into the container 102. The air cleaner 160 includes a high efficiency particulate air (HEPA) filter. In FIGS. 1 and 2, arrows indicate the flow of the clean air.

The inner space of the container 102 is divided into an isopropyl alcohol region 20 and a clean air region 22. Clean air flows into the clean air region 22 of the container 102 through the opening 102a. Reference numeral 30 indicates a boundary surface between the isopropyl alcohol region 20 and the clean air region 30.

In this conventional apparatus, a central portion of the isopropyl alcohol region 20 protrudes upwardly, as shown in FIGS. 1 and 2, because the cooling coil 116 is positioned along the inner sidewall of the container 102 and the clean air flows into the container 102 through the opening 102a. The density of the isopropyl alcohol vapor is low at a portion of the isopropyl alcohol region 20 adjacent to the cooling coil 116 since the portion of the isopropyl alcohol region 20 adjacent to the cooling coil 116 has a relatively low temperature as compared to the temperature of the central portion of the isopropyl alcohol region 20. The clean air flowing into the container 102 through the opening 102a is provided to a bottom portion of the container 102 through the portion of the isopropyl alcohol region 20 having the relatively low density. Hence, the peripheral portion of the container 102 has a density of the isopropyl alcohol vapor lower than that of the central portion of the container 102, thus causing an unstable flow of the isopropyl alcohol at the peripheral portion of the container 102 as compared to the central portion of the container 102. As a result, the isopropyl alcohol vapor 10 cannot be stably provided onto the surfaces of the substrates W positioned at the peripheral portion of the container 102 so that the substrates W positioned at the peripheral portion cannot be sufficiently dried.

More particularly, when the substrates W including patterns are positioned at the peripheral portion of the container 102, watermarks may be formed on the surfaces of the substrates W including the patterns. These watermarks decrease the reliability and the productivity of the semiconductor device. In addition, native oxide films may be formed on the surfaces of the substrates W as the surfaces of the substrates W come into contact with the clean air as the dried substrates W are unloaded from the container 102.

SUMMARY OF THE INVENTION

In an effort to overcome at least some of the above-mentioned problems, the present invention provides an apparatus for drying a semiconductor substrate that can stably and uniformly provide an isopropyl alcohol vapor onto a plurality of semiconductor substrates and prevent native oxide films from forming on the semiconductor substrate.

According to an embodiment of the present invention, a substrate drying apparatus includes a container for receiving an isopropyl alcohol vapor to dry a plurality of substrates wherein an opening is vertically formed through an upper portion of the container to permit the loading and unloading of the substrates; a supporting member for supporting the plurality of substrates in the container in a vertical direction and for supporting the substrates side by side in a horizontal direction, wherein the supporting member extends through the container and through the opening; and a cover for obstructing a flow of clean air from flowing directly from an air cleaner disposed over the container into the container through the opening.

Preferably, a size of the cover is larger than a size of the opening.

The apparatus may further include an isopropyl alcohol supplying pipe connected to a sidewall of the container for supplying an isopropyl alcohol into the container; and a heater connected to the container for generating the isopropyl alcohol vapor by heating the isopropyl alcohol provided in the container. Preferably, the heater is disposed beneath the container.

In a first embodiment of the present invention, the cover is connected to an upper portion of the supporting member. In a second embodiment of the present invention, the cover is disposed at an upper portion of the container adjacent to the opening and movable in a horizontal direction to open and close the opening of the container, and a slot is formed at a side portion of the cover parallel to the direction of motion to prevent interference between the supporting member and the cover. The second embodiment may further include a housing at an upper side portion of the container adjacent to the opening for receiving the cover and a cooling pipe installed in the cover through which a refrigerant is supplied for condensing the isopropyl alcohol vapor.

In an embodiment of the present invention, a bottom surface of the cover is horizontally inclined from a first end thereof to an opposite second end thereof. In another embodiment of the present invention, a bottom surface of the cover is inclined from edge portions thereof toward a central portion thereof.

The apparatus of the present invention may further include an inert gas supplying member connected to the supporting member over the plurality of substrates, the inert gas supplying member supplying an inert gas onto the substrates while the substrates, having been dried by the isopropyl alcohol vapor, are unloaded from the container. The inert gas supplying member may include a spraying head having an interior space for receiving the inert gas, and a plurality of first spraying nozzles for uniformly spraying the inert gas onto the plurality of substrates; and a nozzle pipe disposed in the interior space for supplying the inert gas into the interior space. Alternately, the inert gas supplying member may include a connecting plate having a lower surface; and a plurality of nozzle pipes fixed to the lower surface of the connecting plate for spraying the inert gas onto the substrates.

The apparatus of the present invention may further include a cooling coil disposed over the plurality of substrates supported by the supporting member along an inner sidewall of the container wherein a refrigerant is supplied through the cooling coil for condensing the isopropyl alcohol vapor.

The apparatus of the present invention may further include a receiver tray disposed under the plurality of substrates for receiving a fluid dripped from the plurality of substrates, wherein the isopropyl alcohol vapor is condensed on the substrates so that a surface tension of the fluid is reduced by the condensed isopropyl alcohol; and a draining pipe connected to the receiver tray for draining the fluid received in the receiver tray.

In another embodiment of the present invention, there is provided an apparatus for drying a substrate including a container for receiving isopropyl alcohol wherein an opening is vertically formed through an upper portion of the container; a supporting member for supporting a plurality of substrates in a vertical direction and for supporting the plurality of substrates side by side in a horizontal direction, wherein the supporting member extends through the container and through the opening; a heater connected to the container for forming an isopropyl alcohol vapor to dry the substrates by heating the isopropyl alcohol; and a cover for obstructing a flow of clean air from flowing directly from an air cleaner disposed over the container into the container through the opening.

Preferably, the inert gas supplying member includes a spraying head having an interior space for receiving the inert gas, and a plurality of first spraying nozzles for uniformly spraying the inert gas onto the plurality of substrates; and a nozzle pipe disposed in the interior space, the nozzle pipe having a plurality of second spraying nozzles for providing the inert gas to an upper portion of the interior space.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application No. 2002-53631, filed on Sep. 5, 2002, and entitled: "Apparatus for Drying a Substrate," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
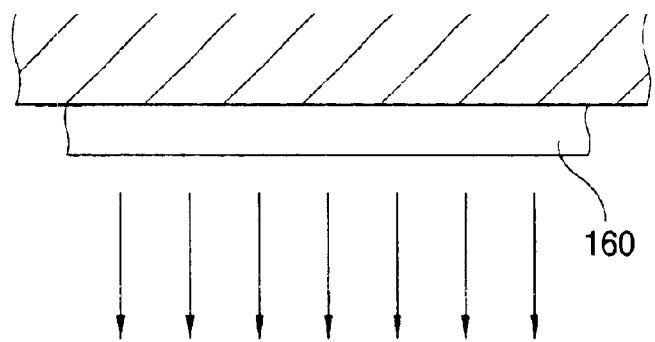
FIG. 1 illustrates a schematic cross-sectional view of a conventional apparatus for drying a substrate.
Figure 1:
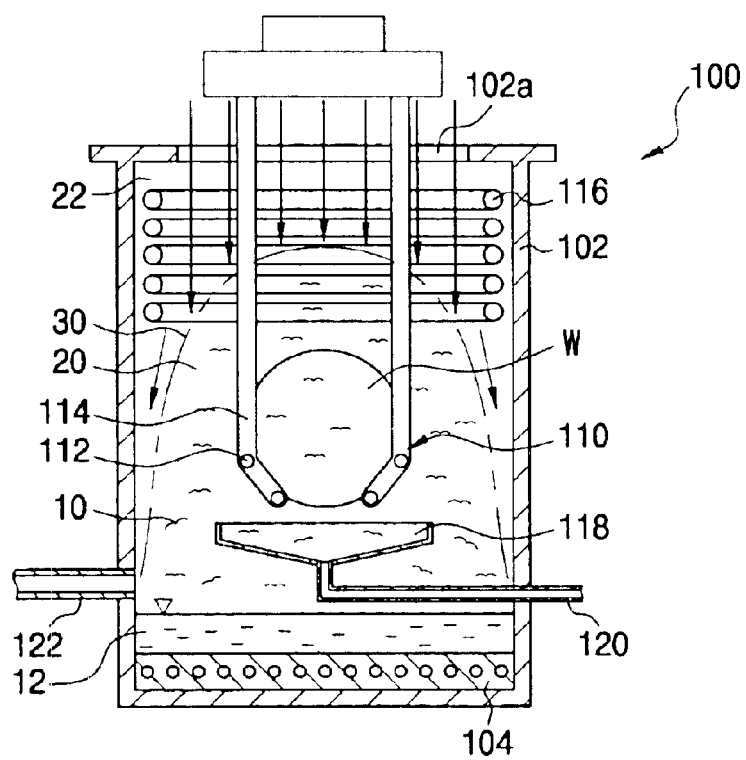
Figure 2:
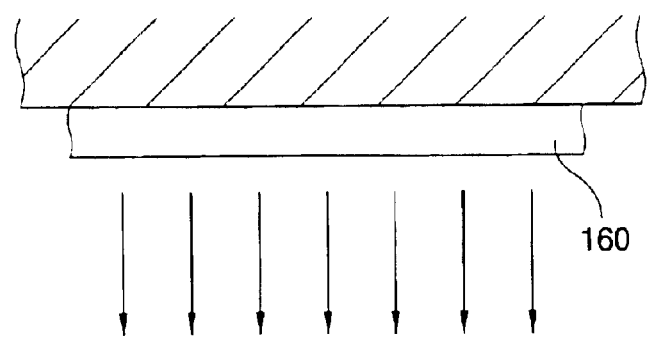
FIG. 2 illustrates a schematic side view of the apparatus for drying a substrate as shown in FIG. 1.
Figure 2:
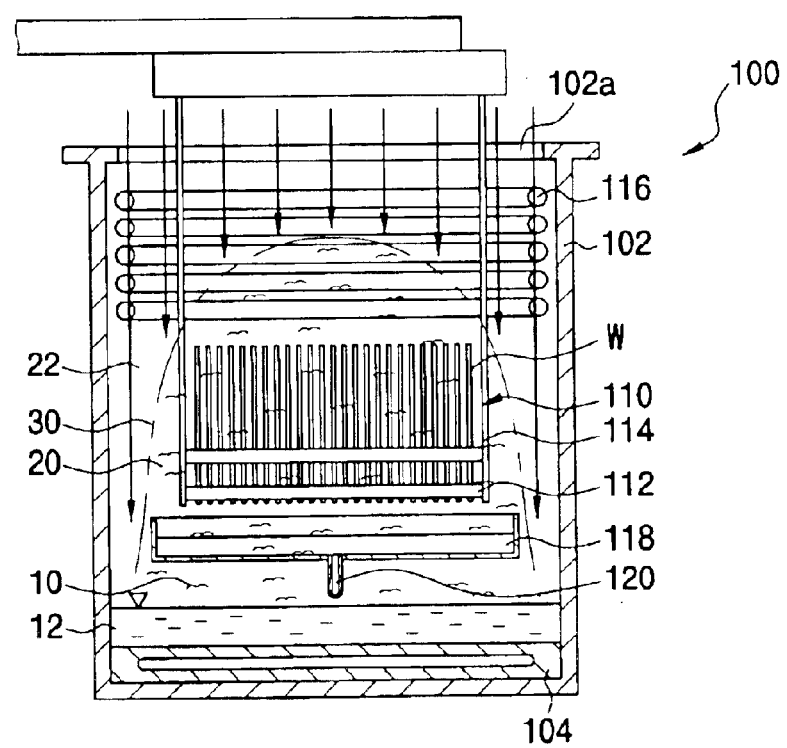
Figure 3:
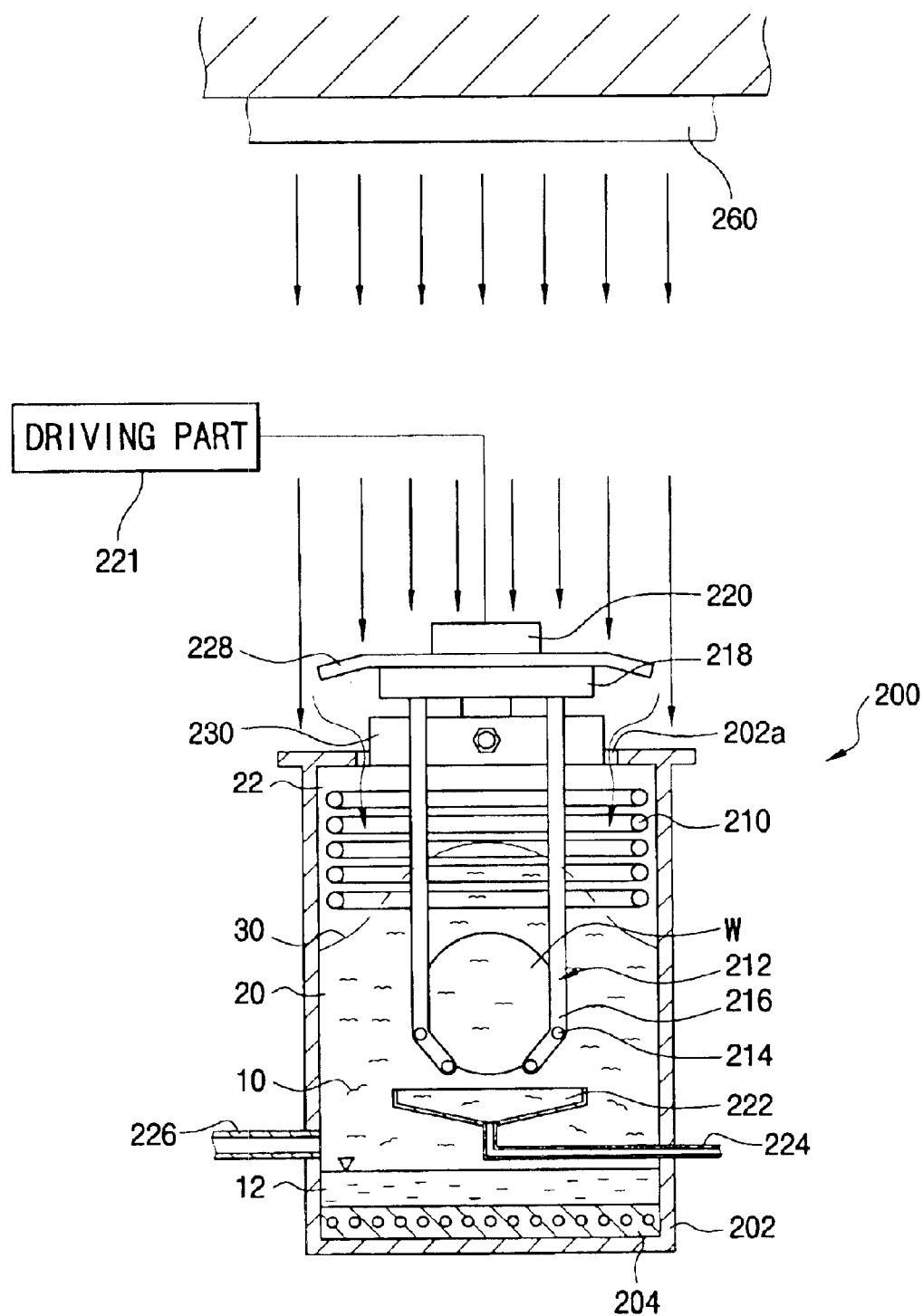
FIG. 3 illustrates a schematic cross-sectional view of an apparatus for drying a substrate according to a first embodiment of the present invention.
Figure 4:
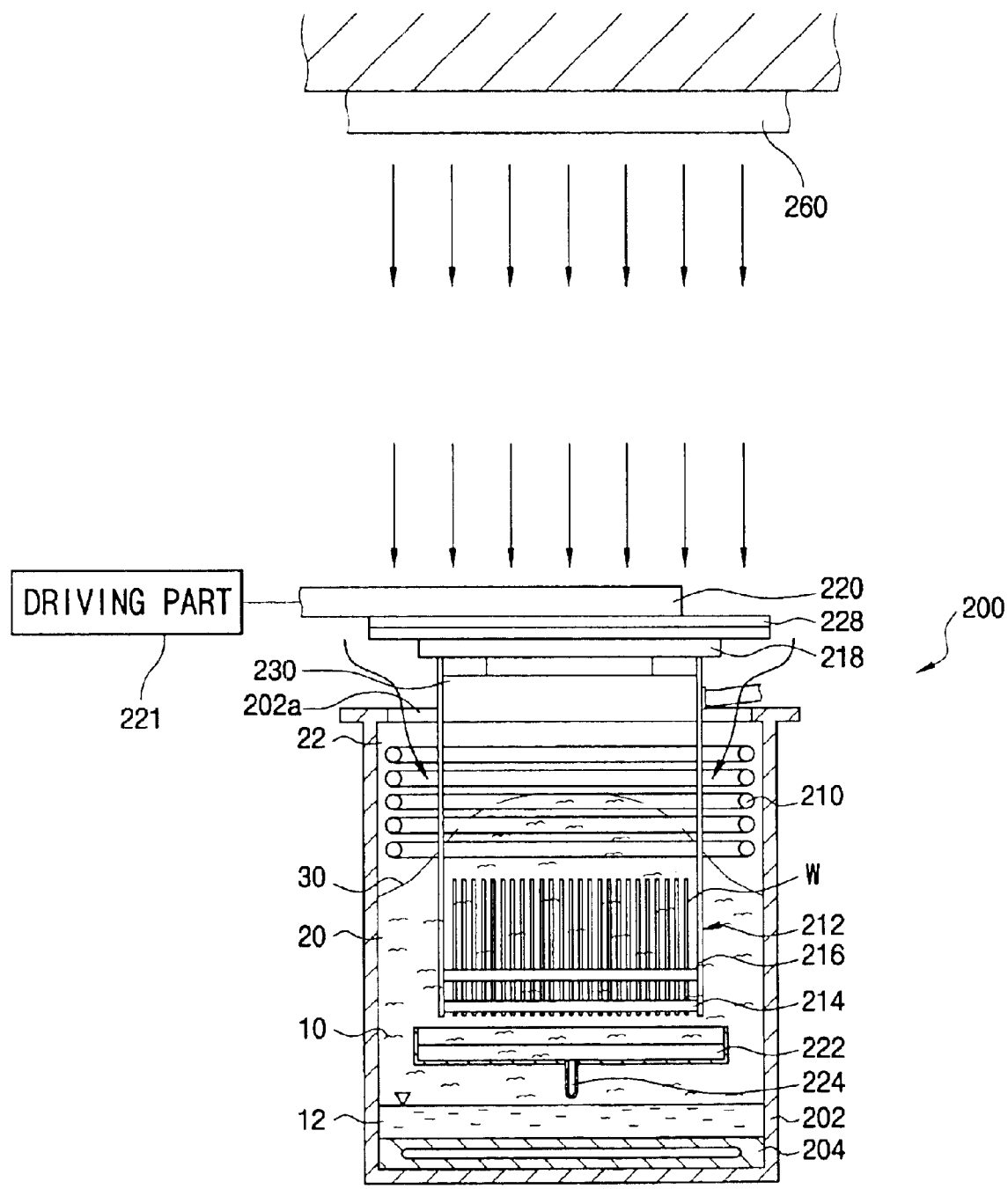
FIG. 4 illustrates a schematic side view of the apparatus for drying a substrate as shown in FIG. 3.
Figure 5:
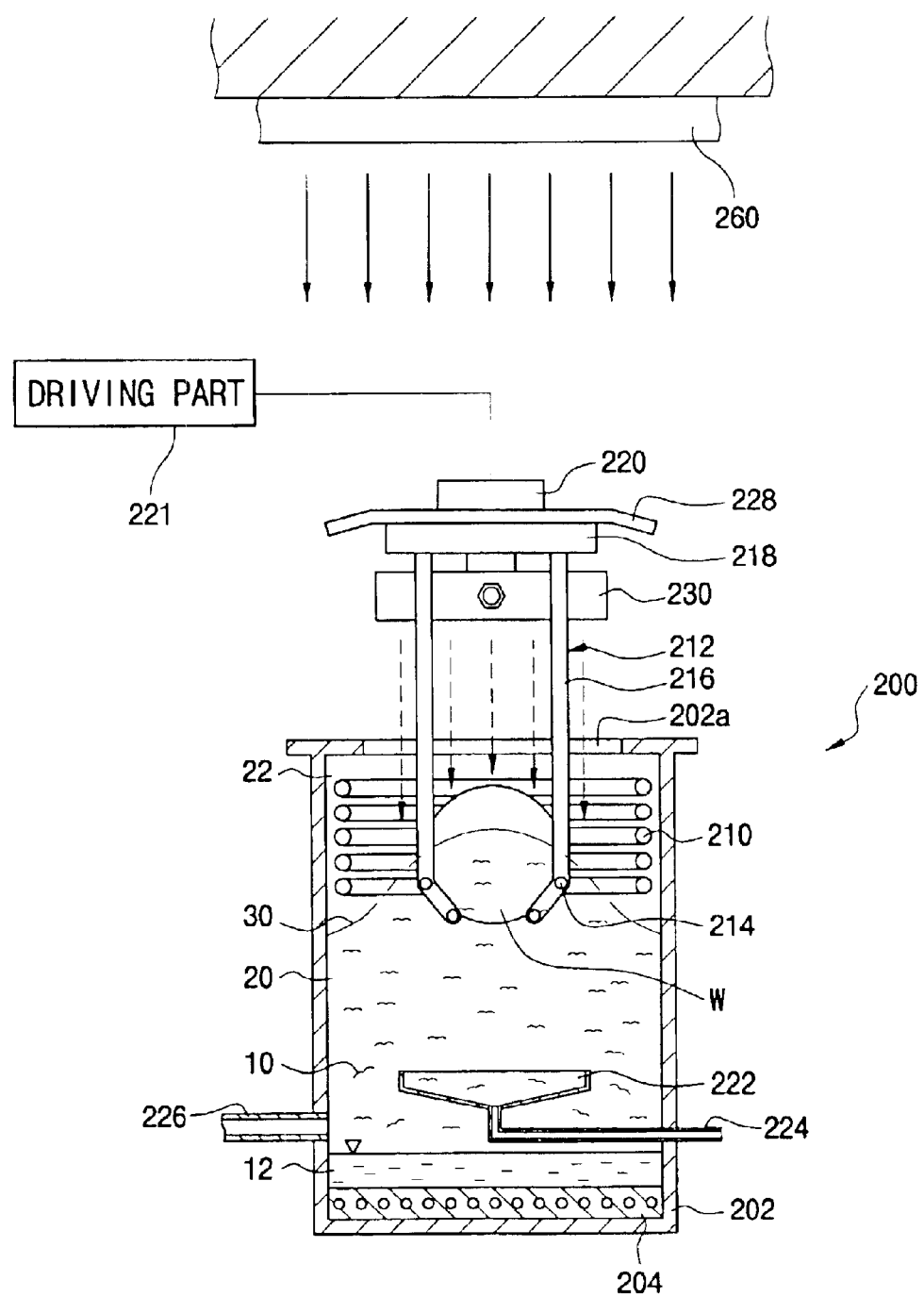
FIG. 5 illustrates a schematic cross-sectional view of the unload state of the semiconductor substrates in an isopropyl alcohol vapor region as shown in FIG. 3.

FIG. 3 illustrates a schematic cross-sectional view of an apparatus for drying a substrate according to a first embodiment of the present invention. FIG. 4 illustrates a schematic side view of the apparatus for drying a substrate as shown in FIG. 3. FIG. 5 illustrates a schematic cross-sectional view of the unload state of the semiconductor substrates in an isopropyl alcohol vapor region as shown in FIG. 3.

Referring to FIGS. 3 to 5, a substrate drying apparatus 200 according to the first embodiment of the present invention dries a plurality of semiconductor substrates W using an isopropyl alcohol vapor 10. In the apparatus, isopropyl alcohol 12 is received in a container 202, and a heater 204 is installed, preferably beneath the container 202, to heat the isopropyl alcohol 12. The isopropyl alcohol 12 is changed into an isopropyl alcohol vapor 10 by the heater 204 so that the isopropyl alcohol vapor 10 forms an isopropyl alcohol vapor region 20 in the container 202.

A cooling coil 210 is disposed over the isopropyl alcohol vapor region 20 along an inner sidewall of the container 202 in order to condense the isopropyl alcohol vapor 10. A refrigerant is provided in the cooling coil 210. After the isopropyl alcohol vapor 10 moves to an upper portion of the container 202, the isopropyl alcohol vapor 10 is condensed by the cooling coil 210, and then the condensed isopropyl alcohol drops into the lower portion of the container 202. Though the heater 204 is preferably disposed beneath the container 202 in FIGS. 3 to 5, the position of the heater 204 may be varied.

An opening 202a is vertically formed through an upper portion of the container 202 to permit the loading and unloading of the semiconductor substrates W. A supporting member 212 extends to the outside of the container 202 through the opening 202a and supports the semiconductor substrates W. The supporting member 212 is connected to a driving part 221 for loading and unloading the semiconductor substrates W over the container 202.

The supporting member 212 includes a plurality of holders 214 and a plurality of vertical arms 216. The holders 214 support the semiconductor substrates W in the vertical direction and dispose the semiconductor substrates W side by side in the horizontal direction. The vertical arms 216 are connected to the holders 214, and upwardly extend through the opening 202a of the container 202. A plurality of slots (not shown) are formed in the holders 214, each of the slots for supporting a corresponding one of the plurality of semiconductor substrates W. The vertical arms 216 are connected to a horizontal arm 220 through a connecting member 218 over the container 202. The horizontal arm 220 is connected to the driving part 221 for loading and unloading the semiconductor substrates W. The semiconductor substrates W are transferred by the horizontal arm 220 connected to the supporting member 212.

After the semiconductor substrates W are cleaned using various cleaning solutions, and finally rinsed with de-ionized water, the semiconductor substrates W are transferred into the container 202 in order to execute a drying process for the semiconductor substrates W. The semiconductor substrates W are loaded into the container 202 through the opening 202a. The semiconductor substrates W are then dried in the isopropyl alcohol vapor region 20 in the container 202. During this process, the temperatures of the semiconductor substrates W are lower than the temperature of the isopropyl alcohol vapor 10. Thus, the isopropyl alcohol vapor 10 condenses on the surfaces of the semiconductor substrates W. The condensed isopropyl alcohol is substituted for the fluid (de-ionized water) remaining on the surfaces of the semiconductor substrates W so that the surface tension of the fluid is reduced. A portion of the fluid on the semiconductor substrates W is evaporated in the container 202, and another portion of the fluid flows down along the surfaces of the semiconductor substrates W due to the weakened surface tension. At that time, the impurities remaining on the surfaces of the semiconductor substrates W are removed from the semiconductor substrates W by the flow of the fluid.

A receiver tray 222 is installed under the semiconductor substrates W supported by the supporting member 212 in order to receive the fluid dripped from the semiconductor substrates W. A draining pipe 224 is connected to a bottom of the receiver tray 222 for draining the fluid from the container 202. The draining pipe 224 passes through a sidewall of the container 202 and extends to the outside. An isopropyl alcohol supplying pipe 226 is connected to an opposite sidewall of the container 202 for supplying the isopropyl alcohol 12 into the container 202.

An air cleaner 260 is disposed over the container 202 to prevent minute particles from flowing into the container 202 by providing a flow of clean air. The air cleaner 260 includes a HEPA filter. In FIGS. 3 to 5, solid arrows indicate the flow of clean air.

A cover 228 is installed between the connecting member 218 and the horizontal arm 220 for preventing the clean air from flowing directly into the container 202 through the opening 202a. Preferably, a size of the cover 228 is larger than a size of the opening 202a of the container 202. Thus, the direct flow of the clean air provided from the air cleaner 260 is obstructed by the cover 228 so that the clean air naturally flows around the cover 228 and into the container 202 through the opening 202a. The clean air that flows into the container 202 forms a clean air region 22 over the isopropyl alcohol vapor region 20. Reference numeral 30 indicates a boundary surface between the clean air region 22 and the isopropyl alcohol vapor region 20. Accordingly, the flow of the clean air does not extend to the lower portion of the container 202, thereby forming a stable isopropyl alcohol vapor region 20 in the container 202. As a result, each of the semiconductor substrates W, which are supported by the supporting member 212, can be uniformly dried.

After the semiconductor substrates W are dried in the isopropyl alcohol vapor region 20, the semiconductor substrates W are unloaded using the supporting member 212 through the opening 202a of the container 202. During this unloading, to prevent native oxide films from forming on the surfaces of the semiconductor substrates W, an inert gas is provided onto the semiconductor substrates W. An inert gas supplying member 230 is installed over the semiconductor substrates W supported by the supporting member 212 to supply the semiconductor substrates W with the inert gas. The inert gas supplying member 230 is coupled to the vertical arms 216 and to the connecting member 218 that connects the vertical arms 216 to the horizontal arm 220. The inert gas prevents the dried semiconductor substrates W from contacting air. More specifically, the inert gas supplying member 230 supplies the inert gas onto the semiconductor substrates W to prevent native oxide films from forming on the semiconductor substrates W while the semiconductor substrates W are unloaded from the container 202 and transferred to a cassette or a front open unified pod (FOUP) for receiving the semiconductor substrates W. In FIG. 5, dashed arrows indicate the flow of the inert gas.

Figure 6:
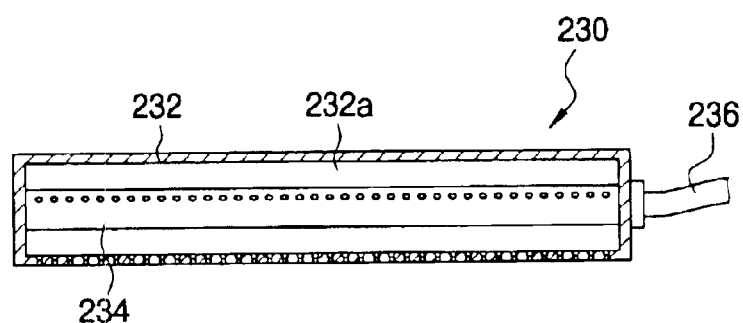
FIG. 6 illustrates a cross-sectional view of an inert gas supplying member as shown in FIG. 3.
Figure 7:
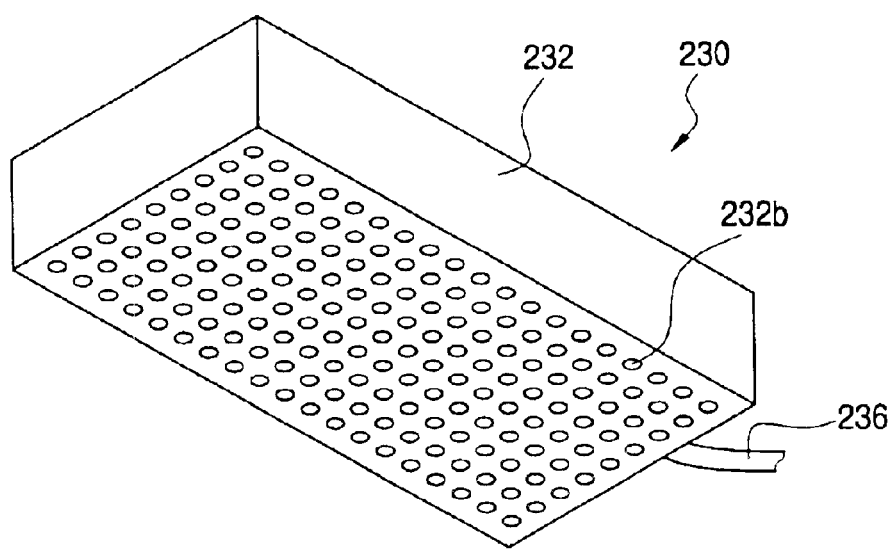
FIG. 7 illustrates a perspective view of a spraying head in FIG. 6.
Figure 8:
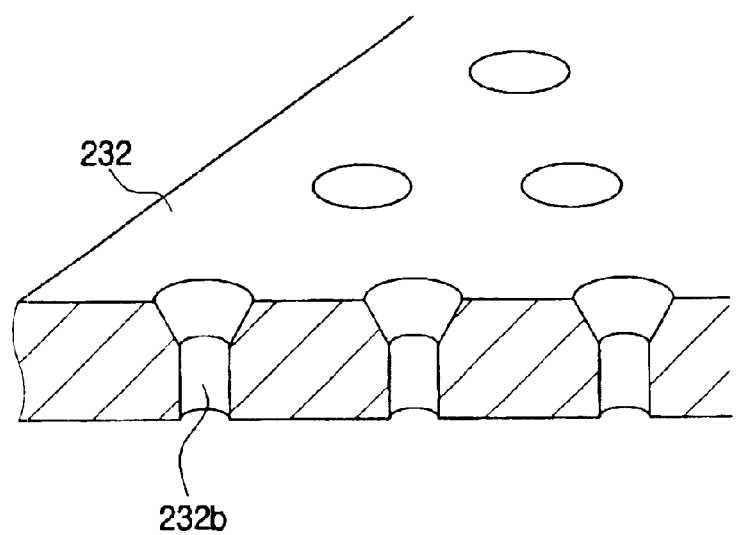
FIG. 8 illustrates a partially cut-away, perspective view of spraying nozzles of the spraying head as shown in FIG. 6.
Figure 9:
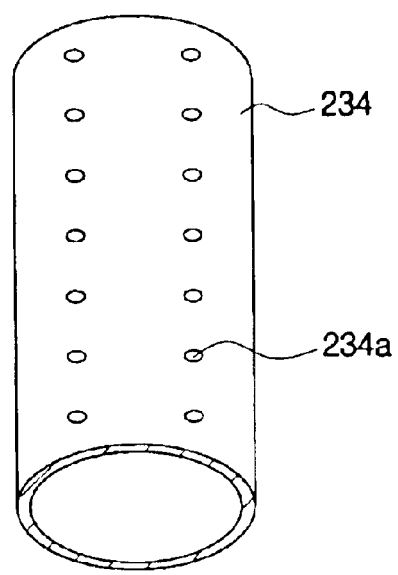
FIG. 9 illustrates a perspective view of the nozzle pipe as shown in FIG. 6.
Figure 10:
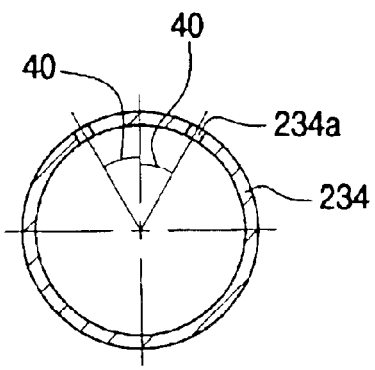
FIG. 10 illustrates a cross-sectional view of the nozzle pipe as shown in FIG. 6.
Figure 11:
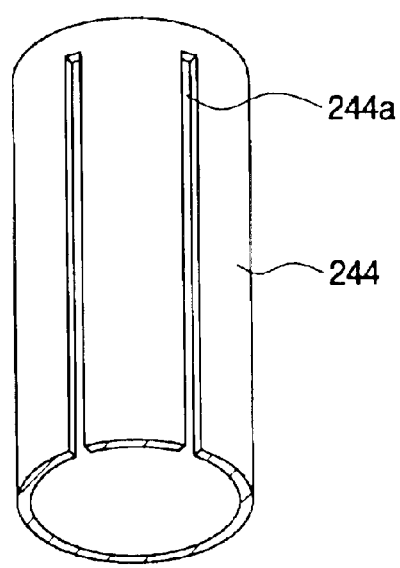
FIG. 11 illustrates a perspective view of another embodiment of the nozzle pipe.

FIG. 6 illustrates a cross-sectional view of the inert gas supplying member as shown in FIG. 3. FIG. 7 illustrates a perspective view of a spraying head in FIG. 6. FIG. 8 illustrates a partially cut-away, perspective view of spraying nozzles of the spraying head as shown in FIG. 6. FIG. 9 illustrates a perspective view of the nozzle pipe as shown in FIG. 6. FIG. 10 illustrates a cross-sectional view of the nozzle pipe as shown in FIG. 6. FIG. 11 illustrates a perspective view of another embodiment of the nozzle pipe.

Referring to FIGS. 6 to 11, the inert gas supplying member 230 includes an interior space 232a, a spraying head 232, and a nozzle pipe 234. The interior space 232a receives the inert gas, and the spraying head 232 has a plurality of first nozzles 232b for spraying the inert gas onto the semiconductor substrates W. The nozzle pipe 234 supplies the inert gas into the interior space 232a.

The first nozzles 232b are formed on a bottom surface of the spraying head 232. The spraying head 232 may have a rectangular box shape, and the first spraying nozzles 232b may have a funnel shape. For example, an upper portion of each of the first spraying nozzles 232b may have a diameter of approximately 2 mm while a lower portion of each of the first spraying nozzles 232b may have a diameter of approximately 1 mm. Each of the first spraying nozzles 232a may have an interval between an adjacent one of the first spraying nozzles 232a of approximately 3 mm. A length of the spraying head 232 may be varied in accordance with the number of semiconductor substrates W. It is preferable that the width of the spraying head 232 is longer than a diameter of each of the semiconductor substrates W.

The nozzle pipe 234 is disposed in the interior space 232a of the spraying head 232 along the length of the spraying head 232. One end portion of the nozzle pipe 234 is connected to an inert gas supplying pipe 236. A plurality of second spraying nozzles 234a are formed through the nozzle pipe 234 along the length of the nozzle pipe 234. The second spraying nozzles 234a supply the inert gas into the interior space 232a of the spraying head 232.

As shown in FIG. 10, the second spraying nozzles 234a are preferably disposed in two columns, and are preferably upwardly inclined at an angle of approximately 60° from the horizontal. The inert gas is supplied to the interior space 232a of the spraying head 232 through the second spraying nozzles 234a, and then the inert gas is uniformly provided onto the semiconductor substrates W through the first spraying nozzles 232b. Because the second spraying nozzles 234a are upwardly inclined, the inert gas can be uniformly provided in the interior space 232a of the spraying head 232. In FIG. 10, the second spraying nozzles 234a have an upwardly inclined angle of approximately 60° from the horizontal direction, i.e., there is an angle of approximately 60° formed between the two columns of the second spraying nozzles.

Alternately, the second spraying nozzles 234a may have various inclined angles. For example, the second spraying nozzles 234a may be upwardly inclined at angles of approximately 45° to 75° from the horizontal line, i.e., there may be an angle of approximately 30° to 90° formed between each adjacent column of the plurality of columns of the second spraying nozzles. Additionally, the second spraying nozzles 234a may be disposed in more than two columns, and the inclined angles of the second spraying nozzles 234a may be varied when the second spraying nozzles 234a are arranged in more than two columns. Furthermore, an alternate embodiment of the nozzle pipe 244 may include second spraying nozzles 244a having slit shapes formed along the length of a nozzle pipe 244, as shown in FIG. 11.

The inert gas may include a nitrogen ($N_2$) gas or an argon (Ar) gas. Typically, nitrogen gas is used in a general process for drying a semiconductor substrate.

Figure 12:
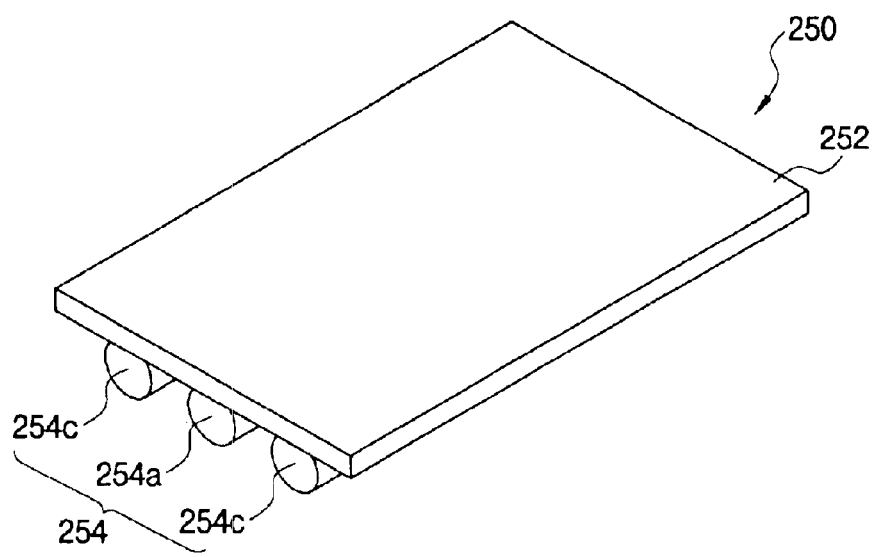
FIG. 12 illustrates a perspective view of another embodiment of the inert gas supplying member.
Figure 13:
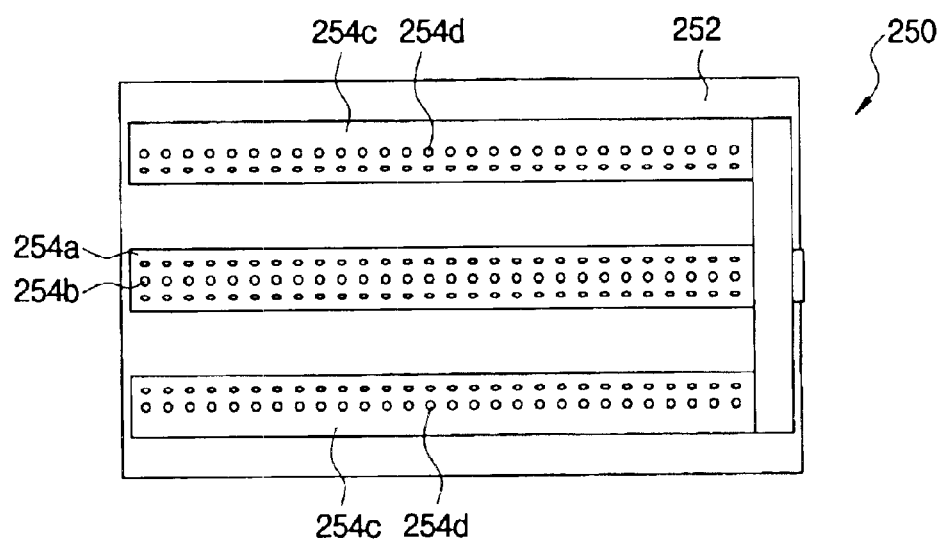
FIG. 13 illustrates a bottom view of the inert gas supplying member as shown in FIG. 12.
Figure 14:
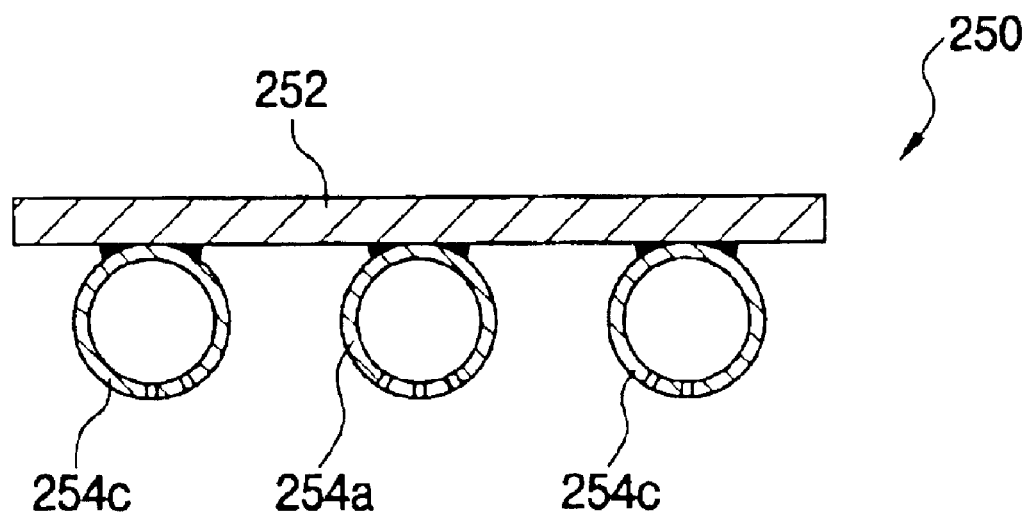
FIG. 14 illustrates a cross-sectional view of the inert gas supplying member as shown in FIG. 12.

FIG. 12 illustrates a perspective view of another embodiment of the inert gas supplying member. FIG. 13 illustrates a bottom view of the inert gas supplying member as shown in FIG. 12. FIG. 14 illustrates a cross-sectional view of the inert gas supplying member as shown in FIG. 12.

Referring to FIGS. 12 to 14, an inert gas supplying member 250 includes a connecting plate 252 and a plurality of nozzle pipes 254.

The connecting plate 252 is fixed to the connecting member 218 and the vertical arms 216. The nozzle pipes 254 are fixed to a lower surface of the connecting plate 252. Though the connecting plate 252 and the nozzle pipes 254 are fixed by a welding method as shown in FIG. 14, various alternate fixing methods may be employed to fix the connecting plate 252 and the nozzle pipes 254. In addition, the number of the nozzle pipes 254 may be varied. In this exemplary embodiment, three nozzle pipes are illustrated.

A central nozzle pipe 254a includes a plurality of spraying nozzles 254b disposed in three columns. Side nozzle pipes 254c include a plurality of spraying nozzles 254d formed in two columns. The spraying nozzles 254b and 254d spray the inert gas onto the semiconductor substrates W supported by the supporting member 212. The constructions and positions of the spraying nozzles 254b and 254d may be varied in order to uniformly provide the semiconductor substrates W with the inert gas.

Figure 15:
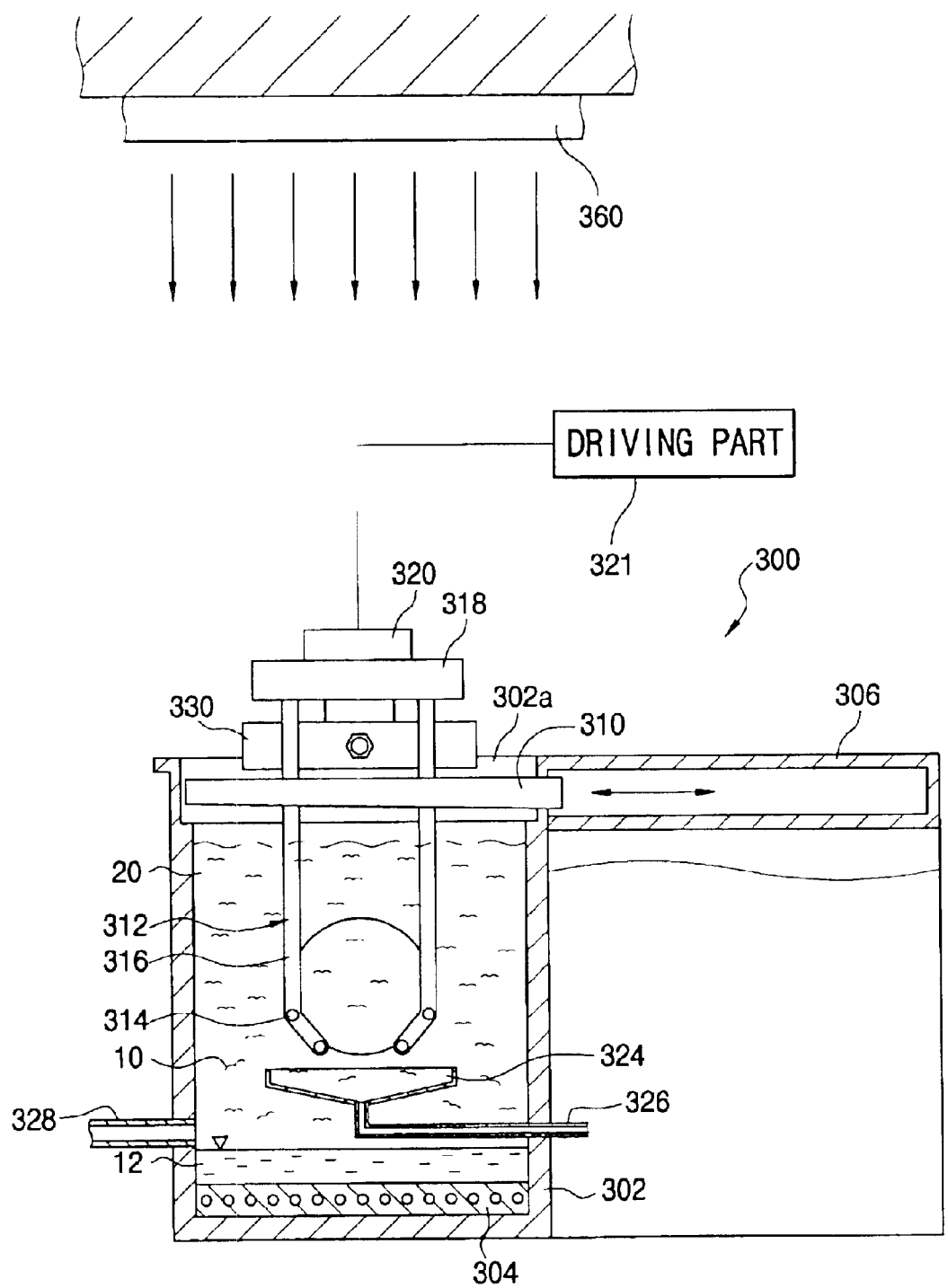
FIG. 15 illustrates a schematic cross-sectional view of a substrate drying apparatus according to a second embodiment of the present invention.
Figure 16:
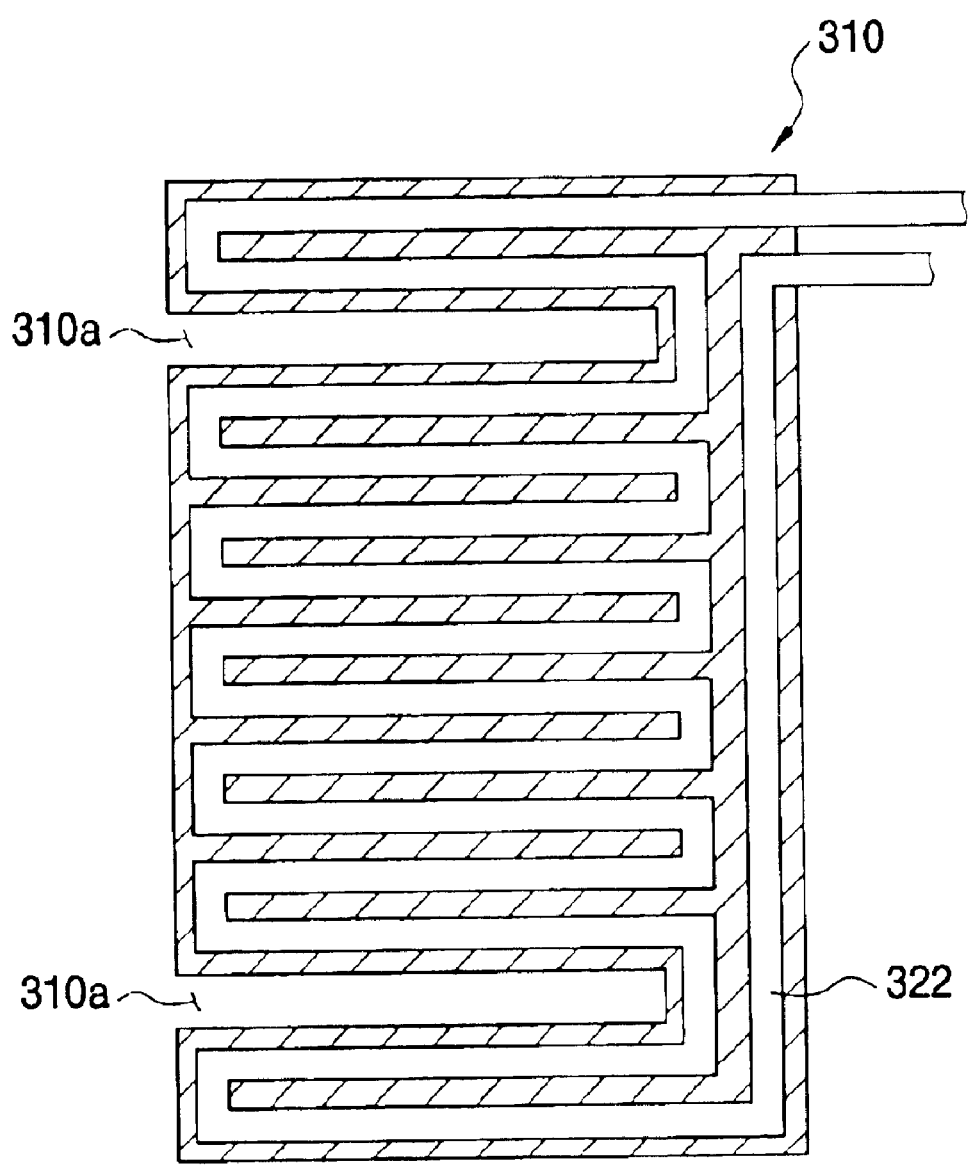
FIG. 16 illustrates an enlarged cross-sectional view of a cover as shown in FIG. 15.

FIG. 15 illustrates a schematic cross-sectional view of a substrate drying apparatus according to a second embodiment of the present invention. FIG. 16 illustrates an enlarged cross-sectional view of a cover as shown in FIG. 15.

Referring to FIGS. 15 and 16, a substrate drying apparatus 300 according to the second embodiment of the present invention dries semiconductor substrates W using an isopropyl alcohol vapor 10. In this apparatus, an isopropyl alcohol 12 is received in a container 302, and a heater 304 is installed, preferably beneath the container 302, to heat the isopropyl alcohol 12.

An opening 302a is vertically formed through an upper portion of the container 302 to permit the loading and unloading of the semiconductor substrates W. The opening 302a is opened or closed by a cover 310 movably installed under the opening 302a in the horizontal direction. A housing 306 is provided to an upper side portion of the container 302 adjacent to the opening 302a so that the cover 310 may be received in the housing 306. A first driving part (not shown) for moving the cover 310 may be installed in the cover 310 or outside of the cover 310.

A supporting member 312 extends to the outside of the container 302 through the opening 302a and supports the semiconductor substrates W. The supporting member 312 includes a plurality of holders 314 and a plurality of vertical arms 316. The holders 314 support the semiconductor substrates W in the vertical direction, and the semiconductor substrates W are disposed on the holders 314 side by side in the horizontal direction. The vertical arms 316 are connected to the holders 214, and upwardly extend through the opening 302a of the container 302. A plurality of slots (not shown) are formed in the holders 314 to support the semiconductor substrates W in the vertical direction. The vertical arms 316 are connected to a horizontal arm 320 through a connecting member 318 over the container 302. The horizontal arm 320 is connected to a second driving part 321 for loading and unloading the semiconductor substrates W.

Slots 310a are formed in a side portion of the cover 310 parallel to the direction of motion to prevent interference between the vertical arms 316 of the supporting member 312 and the cover 310. A cooling pipe 322 is installed in the cover 310 to condense the isopropyl alcohol vapor 10 adjacent to an upper portion of the container 302. A refrigerant is provided in the cooling pipe 322. The isopropyl alcohol vapor 10 is condensed at a bottom surface of the cover 310, and then the condensed isopropyl alcohol flows down along the inner sidewall of the container 302. The bottom surface of the cover 310 is horizontally inclined to prevent the condensed isopropyl alcohol from dripping onto the semiconductor substrates W. Examples of the shape of the bottom surface of the cover are shown in FIGS. 17 and 18.

Figure 17:
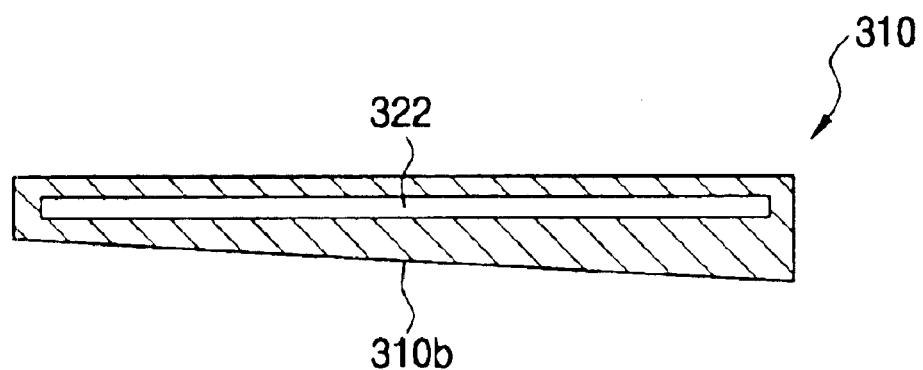
FIG. 17 illustrates a cross-sectional view of a bottom surface of the cover as shown in FIG. 15.

FIG. 17 illustrates a cross-sectional view of a bottom surface of the cover as shown in FIG. 15. FIG. 18 illustrates a cross-sectional view of another embodiment of the bottom surface of a cover.

As shown in FIG. 17, the bottom surface 310b of the cover 310 is inclined from a first end thereof to an opposite second end thereof. Thus, the isopropyl alcohol condensed at the bottom surface 310b of the cover 310 flows down along a sidewall defining the inner space of the container 302.

Figure 18:
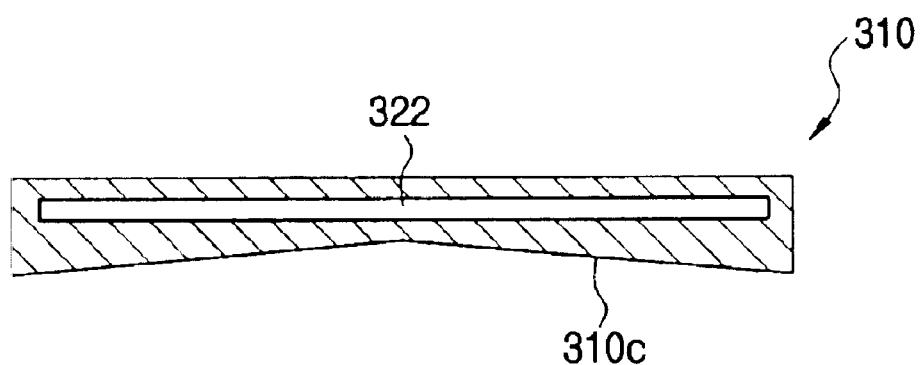
FIG. 18 illustrates a cross-sectional view of another embodiment of the bottom surface of a cover as shown in FIG. 15.

Referring to FIG. 18, edge portions of a bottom surface 310c of the cover 310 are inclined toward a central portion of the bottom surface 310c. Hence, the isopropyl alcohol is condensed at the bottom surface 310b of the cover 310, and then the condensed isopropyl alcohol flows down along both sidewalls defining the inner space of the container 302.

Referring back to FIG. 15, after the semiconductor substrates W are cleaned with various cleaning solutions and finally rinsed with the de-ionized water, the semiconductor substrates W are transferred into the container 302 to perform the drying process. The semiconductor substrates W are dried according to the above-described process of the first embodiment.

A receiver tray 324 is disposed under the semiconductor substrates W supported by a supporting member 312 such that the fluid dripped from the semiconductor substrates W is received in the receiver tray 324. A draining pipe 326 is connected to a bottom of the receiver tray 324 for draining the fluid. The draining pipe 326 passes through a sidewall of the container 302 and extends to the outside. An isopropyl alcohol supplying pipe 328 is connected to an opposite sidewall of the container 302 for supplying the isopropyl alcohol 12 into the container 302.

An air cleaner 360 is disposed over the container 302 and provides a flow of clean air to prevent minute particles from flowing into the container 302. The air cleaner 360 includes the HEPA filter. Because the clean air provided from the air cleaner 360 does not flow directly into the container 302 due to the cover 310, a stable isopropyl alcohol vapor region 20 can be formed in the container 302.

An inert gas supplying member 330 is coupled to the vertical arms 316 and to the connecting member 318. The inert gas supplying member 330 is positioned over the cover 310 when the semiconductor substrates W are loaded in the container 302. The inert gas supplying member 330 supplies the inert gas onto the semiconductor substrates W while the semiconductor substrates W, having been dried by the isopropyl alcohol vapor 10, are unloaded from the container 302 and transferred to a cassette or a FOUP for receiving the semiconductor substrates W. The inert gas supplying member 330 of the second embodiment is identical to that of the first embodiment as shown in FIG. 3.

According to the present invention, a cover obstructs a flow of clean air flowing into a container through an opening so that an isopropyl alcohol vapor region can be stably formed in the container. Therefore, the semiconductor substrates can be stably and uniformly dried during the drying process.

In addition, the formation of native oxide films on the surfaces of the semiconductor substrates is prevented by an application of an inert gas provided onto the semiconductor substrates while the dried semiconductor substrates are unloaded and transferred to the cassette or the FOUP.

Exemplary and preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An apparatus for drying a substrate, comprising:
    a container for receiving an isopropyl alcohol vapor to dry a plurality of substrates wherein an opening is vertically formed through an upper portion of the container to permit the loading and unloading of the substrates;
    a supporting member for supporting the plurality of substrates in the container in a vertical direction and for supporting the substrates side by side in a horizontal direction, wherein the supporting member extends through the container and through the opening;
    an air cleaner disposed over the container for providing clean air into the container through the opening; and
    a cover for directing a flow of the clean air from the air cleaner so that the clean air flows around the cover and into the container during the drying of the plurality of substrates.

2. The apparatus for drying a substrate as claimed in claim 1, wherein a size of the cover is larger than a size of the opening.

3. The apparatus for drying a substrate as claimed in claim 1, further comprising:
    an isopropyl alcohol supplying pipe connected to a sidewall of the container for supplying an isopropyl alcohol into the container; and
    a heater connected to the container for generating the isopropyl alcohol vapor by heating the isopropyl alcohol provided in the container.

4. The apparatus for drying a substrate as claimed in claim 3, wherein the heater is disposed beneath the container.

5. The apparatus for drying a substrate as claimed in claim 1, wherein the cover is connected to an upper portion of the supporting member.

6. The apparatus for drying a substrate as claimed in claim 1, wherein the cover is disposed at an upper portion of the container adjacent to the opening and movable in a horizontal direction to open and close the opening of the container, and a slot is formed at a side portion of the cover parallel to the direction of motion to prevent interference between the supporting member and the cover.

7. The apparatus for drying a substrate as claimed in claim 6, further comprising a housing at an upper side portion of the container adjacent to the opening for receiving the cover.

8. The apparatus for drying a substrate as claimed in claim 6, further comprising a cooling pipe installed in the cover through which a refrigerant is supplied for condensing the isopropyl alcohol vapor.

9. The apparatus for drying a substrate as claimed in claim 8, wherein a bottom surface of the cover is horizontally inclined from a first end thereof to an opposite second end thereof.

10. The apparatus for drying a substrate as claimed in claim 8, wherein a bottom surface of the cover is inclined from edge portions thereof toward a central portion thereof.

11. The apparatus for drying a substrate as claimed in claim 1, further comprising an inert gas supplying member connected to the supporting member over the plurality of substrates, the inert gas supplying member supplying an inert gas onto the substrates while the substrates, having been dried by the isopropyl alcohol vapor, are unloaded from the container.

12. The apparatus for drying a substrate as claimed in claim 11, wherein the inert gas supplying member comprises:
    a spraying head having an interior space for receiving the inert gas, and a plurality of first spraying nozzles for uniformly spraying the inert gas onto the plurality of substrates; and
    a nozzle pipe disposed in the interior space for supplying the inert gas into the interior space.

13. The apparatus for drying a substrate as claimed in claim 12, further comprising an inert gas supplying pipe connected to an end portion of the nozzle pipe.

14. The apparatus for drying a substrate as claimed in claim 12, wherein the spraying head has a rectangular box shape.

15. The apparatus for drying a substrate as claimed in claim 12, wherein a width of the spraying head is longer than a diameter of each of the substrates.

16. The apparatus for drying a substrate as claimed in claim 12, wherein the plurality of first spraying nozzles have a funnel shape.

17. The apparatus for drying a substrate as claimed in claim 12, wherein the nozzle pipe comprises a plurality of second spraying nozzles for supplying the inert gas to an upper portion of the interior space.

18. The apparatus for drying a substrate as claimed in claim 17, wherein the second spraying nozzles are arranged in a plurality of columns.

19. The apparatus for drying a substrate as claimed in claim 17, wherein the second spraying nozzles are arranged in two columns.

20. The apparatus for drying a substrate as claimed in claim 12, wherein the nozzle pipe has a second spraying nozzle for supplying the inert gas to an upper portion of the interior space, and the second spraying nozzle has a slit shape formed along length of the nozzle pipe.

21. The apparatus for drying a substrate as claimed in claim 11, wherein the inert gas supplying member comprises:
    a connecting plate having a lower surface; and
    a plurality of nozzle pipes fixed to the lower surface of the connecting plate for spraying the inert gas onto the substrates.

22. The apparatus for drying a substrate as claimed in claim 21, wherein the plurality of nozzle pipes comprise a central nozzle pipe and at least one side nozzle pipe.

23. The apparatus for drying a substrate as claimed in claim 22, wherein the central nozzle pipe comprises a plurality of central spraying nozzles.

24. The apparatus for drying a substrate as claimed in claim 23, wherein the plurality of central spraying nozzles are disposed in three columns.

25. The apparatus for drying a substrate as claimed in claim 22, wherein the at least one side nozzle pipe comprises a plurality of side spraying nozzles.

26. The apparatus for drying a substrate as claimed in claim 25, wherein the plurality of side spraying nozzles are disposed in two columns.

27. The apparatus for drying a substrate as claimed in claim 1, further comprising a cooling coil disposed over the plurality of substrates supported by the supporting member along an inner sidewall of the container wherein a refrigerant is supplied through the cooling coil for condensing the isopropyl alcohol vapor.

28. The apparatus for drying a substrate as claimed in claim 1, further comprising:
    a receiver tray disposed under the plurality of substrates for receiving a fluid dripped from the plurality of substrates, wherein the isopropyl alcohol vapor is condensed on the substrates so that a surface tension of the fluid is reduced by the condensed isopropyl alcohol; and a draining pipe connected to the receiver tray for draining the fluid received in the receiver tray.

29. The apparatus for drying a substrate as claimed in claim 1, wherein the supporting member includes:

a plurality of holders for supporting the substrates; and a plurality of vertical arms connected to the holders and extending through the container and through the opening.

30. The apparatus for drying a substrate as claimed in claim 29, further comprising:

a horizontal arm connected to the vertical arms for transferring the substrates supported by the holders; and a connecting member for connecting the horizontal arm and the vertical arms.

31. The apparatus for drying a substrate as claimed in claim 30, further comprising a driving part connected to the horizontal arm, the driving part for loading and unloading the plurality of substrates.

32. An apparatus for drying a substrate, comprising:

a container for receiving isopropyl alcohol wherein an opening is vertically formed through an upper portion of the container;

a supporting member for supporting a plurality of substrates in a vertical direction and for supporting the plurality of substrates side by side in a horizontal direction, wherein the supporting member extends through the container and through the opening;

a heater connected to the container for forming an isopropyl alcohol vapor to dry the substrates by beating the isopropyl alcohol;

an air cleaner disposed over the container for providing clean air into the container through the opening; and a cover for diverting a flow of the clean air from the air cleaner so that the clean air flows around the cover and into the container during the drying of the plurality of substrates.

33. The apparatus for drying a substrate as claimed in claim 32, wherein the cover is disposed on the supporting member, and a size of the cover is larger than a size of the opening.

34. The apparatus for drying a substrate as claimed in claim 32, wherein the cover is disposed at an upper portion of the container adjacent to the opening and movable in the horizontal direction to open and close the opening of the container, and a slot is formed at a side portion of the cover parallel to a direction of motion to prevent interference between the supporting member and the cover.

35. The apparatus for drying a substrate as claimed in claim 32, further comprising an inert gas supplying member connected to the supporting member over the plurality of substrates to supply an inert gas onto the plurality of substrates while the substrates, having been dried by the isopropyl alcohol vapor, are unloaded from the container and are transferred to a cassette for receiving the substrates.

36. The apparatus for drying a substrate as claimed in claim 35, wherein the inert gas supplying member comprises:

a spraying head having an interior space for receiving the inert gas, and a plurality of first spraying nozzles for uniformly spraying the inert gas onto the plurality of substrates; and a nozzle pipe disposed in the interior space, the nozzle pipe having a plurality of second spraying nozzles for providing the inert gas to an upper portion of the interior space.

* * * * *